United States Patent [19]

Vriens et al.

[11] Patent Number: 5,813,753
[45] Date of Patent: Sep. 29, 1998

[54] UV/BLUE LED-PHOSPHOR DEVICE WITH EFFICIENT CONVERSION OF UV/BLUES LIGHT TO VISIBLE LIGHT

[75] Inventors: Leendert Vriens; Gerard Acket, both of Eindhoven, Netherlands; Cornelis Ronda, Aachen, Germany

[73] Assignee: Philips Electronics North America Corporation, New York, N.Y.

[21] Appl. No.: 863,987

[22] Filed: May 27, 1997

[51] Int. Cl.⁶ .................................................. H04N 9/31
[52] U.S. Cl. ....................... 362/293; 313/112; 313/113; 313/114; 313/502; 313/506; 313/512; 362/800; 362/293; 362/260; 257/98; 257/97; 257/13
[58] Field of Search ..................... 313/112, 113, 313/114, 502, 506, 512; 362/800, 293; 257/98, 97, 13

[56] References Cited

U.S. PATENT DOCUMENTS

| | | | |
|---|---|---|---|
| 4,634,926 | 1/1987 | Vriens et al. | 313/474 |
| 4,647,812 | 3/1987 | Vriens et al. | 313/474 |
| 4,822,144 | 4/1989 | Vriens | 350/339 |
| 4,882,617 | 11/1989 | Vriens | 358/60 |
| 5,557,115 | 9/1996 | Shaluda | 257/81 |

FOREIGN PATENT DOCUMENTS

| | | | |
|---|---|---|---|
| 0581232A | 2/1994 | European Pat. Off. | H05B 33/12 |
| 0712148 | 5/1996 | European Pat. Off. | H01J 17/49 |
| 5152609 | 6/1993 | Japan | H01L 33/00 |

OTHER PUBLICATIONS

"Philips Technical Review", Interference filters in projection television tubes, vol. 44, No. 7, Mar. 1989, L. Vriens, J.A. Clarke and J.H.M. Spruit.

"Interference filters in projection television tubes", L. Vriens, J.A. Clarke et al, Philips Technical Review, vol. 44, No. 7, Mar. 1989, pp. 201–210.

*Primary Examiner*—Sandra L. O'Shea
*Assistant Examiner*—Matthew J. Gerike
*Attorney, Agent, or Firm*—John C. Fox

[57] ABSTRACT

A light emitting device for use in lighting and/or display applications includes a UV/blue LED located in a depression having reflecting sidewalls, a light transmitting material surrounding the LED and filling the depression, and a phosphor in the form of particles either dispersed in the light transmitting material or adhered to the surface of the LED. The sidewalls reflect UV as well as visible light, thus enhancing the efficiency of the device. Optical filters located on the top of the LED and/or the bottom of a UV absorbing glass plate covering the depression further enhance efficiency and/or spectral characteristics of the emitted light.

16 Claims, 5 Drawing Sheets ns of the LED stack 13 and the cup-shaped header 14 in which the LED is placed, as is illustrated in FIG. 1.

UV/BLUE LED-PHOSPHOR DEVICE WITH EFFICIENT CONVERSION OF UV/BLUES LIGHT TO VISIBLE LIGHT

CROSS REFERENCE TO RELATED APPLICATIONS

Copending U.S.patent application Ser. No. (Attorney Docket No. PHA 23,249), filed concurrently herewith, relates to UV/Blue LED/phosphor light emitting devices having enhanced light output.

BACKGROUND OF THE INVENTION

This invention relates to light emitting devices comprising a UV/blue-emitting light emitting diode (LED) and a UV/blue-excitable, visible light emitting phosphor. Such light emitting devices are disclosed in Japanese Kokai No. 5-152609, and U.S. patent application Ser. No. 08/661,520 (Attorney Docket No. PHA 23,132) filed Jun. 11, 1996.

As used herein, the term "UV/blue LED" means an LED emitting in the UV range, or in the blue range, or in both the UV and blue ranges of the electromagnetic spectrum.

Visible light emitting diodes (LED's) are well known. These are multilayer epitaxial structures based mainly on AlGaAs and InGaAlP as basic materials. In these LED's the light is generated in an active region having a refractive index n of about 3.5, and emitted with an isotropic angular distribution. The light then has to pass interfaces to exit the LED. Such LED's are typically encapsulated in an epoxy with refractive index n of about 1.5. Application of Snell's law shows that only light emitted from the active region within an angle theta of about 0.443 radians to the normal of the interface with the epoxy can exit from the top of the LED stack. For larger angles there is total internal reflection. This means that only a fraction (1-cos(theta)), hence 9.6%, of the light can be used.

This problem has been recognized and the efficiency of visible LED's has been enhanced significantly by reflecting visible light emitted from the sides of the LED stack, so called edge light, towards the viewing side. The edge emission of LED's is especially important when internal losses are low so that light internally reflected from the top or bottom of the LED stack can escape from the edges without too much absorption. The subsequent escape of visible light from the epoxy to air is done in a relatively efficient way by shaping the epoxy 11 in the form of a dome 12 with relatively large dimensions compared to the dimensions of the LED stack 13 and the cup-shaped header 14 in which the LED is placed, as is illustrated in FIG. 1.

Because of this large dimension most of the top and edge light coming from the LED has a small angle with the normal when arriving at the dome-air interface, and most of this light will thus be transmitted.

Because of recent advances in GaN-based epitaxial devices, it has become possible to make UV/blue lasers as well as UV/blue LED's. For some applications, conversion of UV/blue light from an LED to visible (e.g. red, green, blue or white) light using phosphors may be more attractive than the direct application of visible LED's. Such UV/blue-LED phosphor devices, for example, offer the opportunity to encompass a wider color range, which is important for display as well as for illumination applications.

Successful implementation of such device applications is of course dependent upon the efficient conversion of UV/blue light into visible light and the subsequent efficient extraction of the generated visible light from the device.

OBJECTS AND SUMMARY OF THE INVENTION

Accordingly, it is an object of the invention to enhance this efficient conversion and extraction of light from a UV/blue LED-phosphor device.

It is another object of the invention to modify the spectral distribution of the emitted light from such a device.

In GaN-based UV/blue LED's, the UV/blue light is generated in an active region having a refractive index of about 2.5, significantly below the earlier quoted value of 3.5 for visible LED's based on GaAs. The angular distribution of this light is also isotropic. Because of this lower refractive index, one might think that a much larger fraction of UV/blue light will be emitted through the top of the stack into the epoxy, and that edge light will thus be much less important.

However, application of Snell's law shows that only light emitted in the active region within an angle theta=0.644 radians to the normal of the interface with the epoxy can ultimately exit from the top of the LED into the epoxy. For larger angles there still is total internal reflection. This means that in this case a fraction (1-cos(theta)), hence still only about 20%, of the light can be used. Thus, about 80% of the generated UV/blue is lost, so that edge light may still be important when the absorption of UV/blue in the LED stack is relatively small.

Accordingly, a first aspect of the invention is to use a major part of the edge light in such a device by the use and appropriate positioning of reflectors and phosphor.

A second aspect of the invention is to affect the angular emission and the color of the visible light emitted by the UV/blue LED-phosphor device by the use of one or more dielectric filters in the device.

In accordance with the invention, a light emitting device for use in lighting and/or display applications includes a UV/blue LED located in a depression having reflecting sidewalls, a light transmitting material surrounding the LED and filling the depression, and a phosphor in the form of particles either dispersed in the light transmitting material or adhered to the surface of the LED. The sidewalls reflect UV/blue as well as visible light, thus enhancing the efficiency of the device Optical filters located on the top of the LED and/or the bottom of a UV/blue absorbing glass plate covering the depression further enhance efficiency and/or spectral characteristics of the emitted light. For example, in a two dimensional array of such LED's, an associated array of color filters can be used to convert white light to colored light, or to enhance the color purity of colored light.

BRIEF DESCRIPTION OF THE DRAWING

The invention will be explained and illustrated in terms of a number of embodiments, with the help of the drawings, in which:

FIG. 1b is a detailed view of the LED in the device of FIG. 1a;

DESCRIPTION OF THE PREFERRED EMBODIMENTS

Figure 1B:
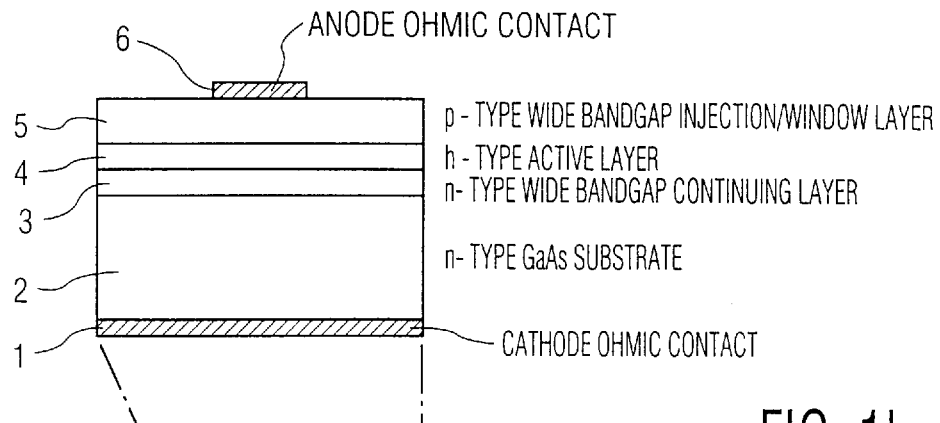

The UV/blue LED's employed in the light emitting devices of the invention are similar in structure to those of visible LED's of the type shown in FIG. 1b, ie, such structures include at a minimum a lower ohmic contact 1, a substrate 2, an active layer 4 sandwiched between lower and upper wide band gap confining layers 3 and 5, a wide band gap injection/window layer 5, and an upper ohmic contact 6. However, UV/blue LED's are based on GaN and its alloys, instead of GaAs and its alloys. Such LED's may include one or more additional layers, such as guiding layers and buffer layers. In addition, the injection/window layer may itself be a multilayer structure, having a graded band gap.

A more detailed description of such GaN-based LED's may be found in copending U.S. patent application Ser. No. 08/661,528 (Attorney Docket No. PHA 23,132), filed Jun. 11, 1996, the contents of which are incorporated herein by reference.

Embodiment 1

Figure 1A:
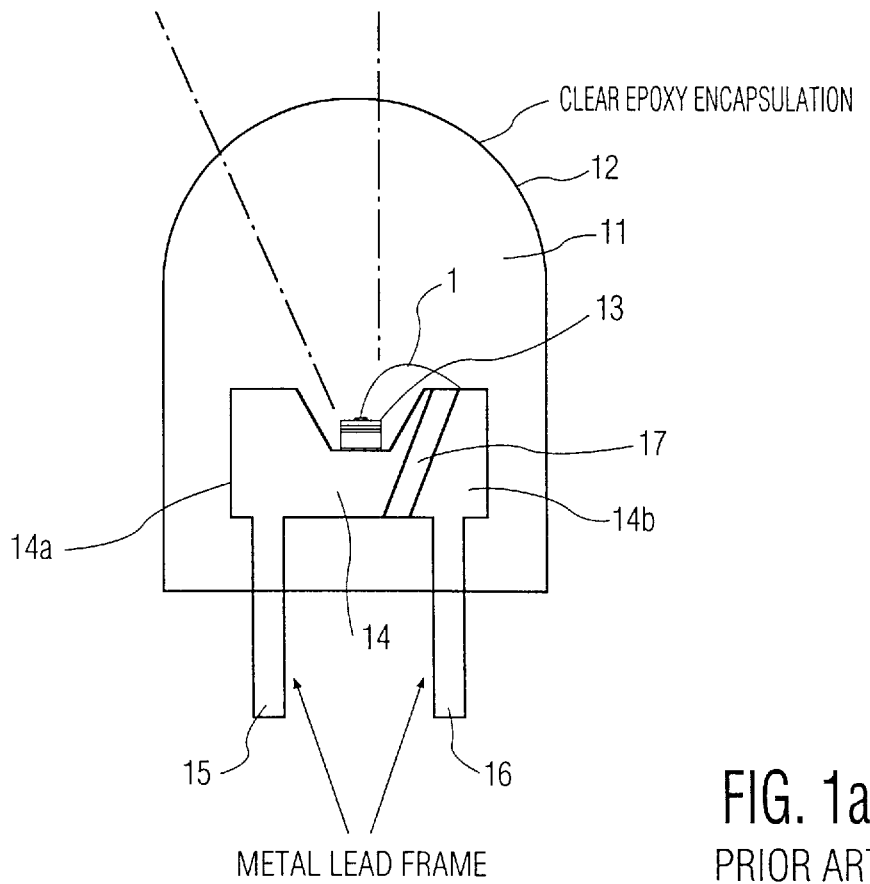
FIG. 1a is a schematic diagram of a visible light emitting device of the prior art employing a visible LED.
Figure 2:
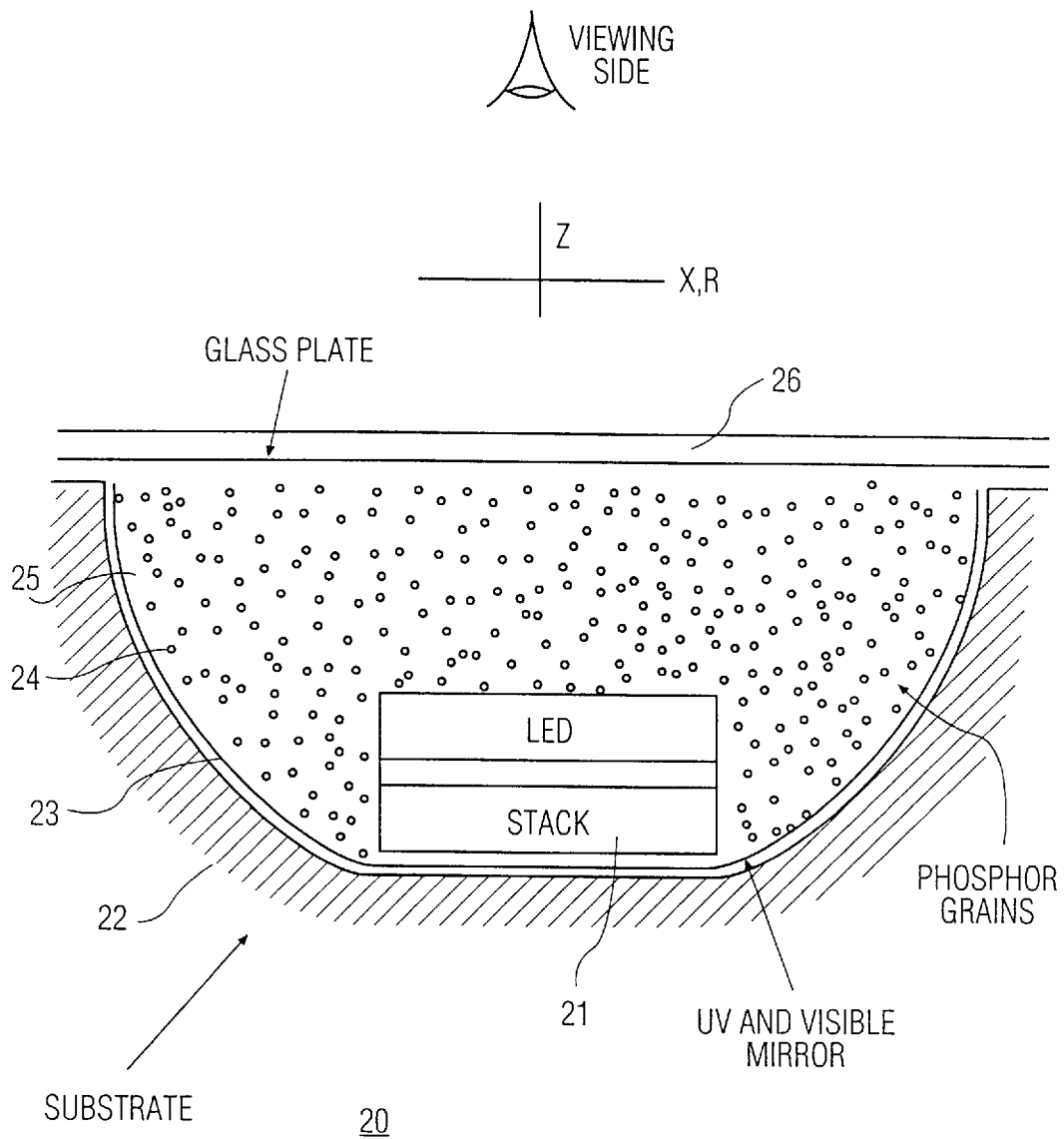
FIGS. 2 is a schematic diagram of a portion of a first embodiment of the UV/blue LED-phosphor device of the invention.

Referring now to FIG. 2, a device 20 of the invention includes UV/blue-LED stack 21, which is placed in a (e.g. plastic) cup-shaped header 22, similar to the header 14 shown in FIG. 1a. Provided on the inside of the cup is a mirror 23 which reflects both the UV/blue light generated by the LED 21 as well as the visible light generated by the phosphor 24. When the viewing side is called the front side, the feedthroughs with electrical connections can be on the back side, in a manner similar to that shown in FIG. 1.

Specifically, the header in FIG. 1 is divided by insulating region 17 into two conducting portions 14a and 14b, from which leads 15 and 16 extend. LED 13 makes contact with portion 14a via contact layer 1, while lead wire 7 connects portion 14b with contact layer 6.

The cup is filled with transparent material 25, preferably a UV/blue light resistant epoxy such as a cycloaliphatic epoxy, through which the phosphor 24 is mixed homogeneously. The product of phosphor grain density and grain size should be made high enough to ensure that most of the UV/blue light is converted to visible light. To prevent UV/blue light which is not absorbed by the phosphor grains from exiting into air, a small flat glass plate 26 can be placed on the top of the cup-shaped header. Edge light which is not absorbed by the phosphor grains 24 will be reflected by mirror 23 back for another opportunity to be absorbed. Thus, the efficiency of the device is enhanced.

An advantage of mixing the phosphor grains through the epoxy is that the number of processing steps is reduced compared to the case when phosphor layers are deposited separately. The latter would involve deposition with a binder and a separate baking step to get rid of the binder material. When necessary, the phosphor grains can be provided with a protective coating to avoid possible reactions between phosphor grains and the epoxy.

The phosphor grains in the embodiment of FIG. 2 can be either of one phosphor emitting one color (broadband, narrow band or multi line, e.g. red, green, blue, yellow or white), or a mixture of phosphor grains emitting different colors, to get a good color rendering.

The visible light will be emitted isotropically within the epoxy. Upon exiting from the epoxy to air there is a transition from n=1.5 to n=1.0. Applying Snell's law again we find that only visible light emitted in the n=1.5 material within an angle theta=0.730 radians to the normal of the interface can exit into the air with n=1.0. For larger angles there is total internal reflection. This means that a fraction (1-cos (theta)), hence still only 25.6% of the light can be extracted.

However, most phosphors have a refractive index of 2 or larger. With an epoxy which is highly transparent and which has a significantly smaller refractive index than the phosphor grains, this means that the back-reflected light will be (multiply) scattered by the phosphor grains. Part of this will be redistributed to angles within the 0.730 radians to the normal and can then exit into air. By thus ensuring a sufficiently different refractive index of epoxy and phosphor, the emission of visible light into air is enhanced by this angular redistribution. Roughening the outer surface of the epoxy may also be used to change the angles of incidence of the light on the epoxy-air interface and to enhance the overall light emission.

FIG. 2 thus shows an embodiment in which efficient use is made of edge UV/blue light and in which the generated visible light is also collected in an efficient way. The UV/-visible light mirror on the inside of the cup makes a major contribution to the efficient use of both UV and visible light.

The UV/blue LED-phosphor device shown in FIG. 2 employing a single LED can be used alone or together with other such devices. For example, such devices can be arranged in 1- or 2-dimensional arrays, with each separate LED in a cup with internal mirror and filled with epoxy and phosphor. Furthermore, one can also make an LED stack which is much longer in one direction, for example the y-direction (normal to the plane of the Figure) than in the other (the x-) direction. In that case, the cup would become a channel of sufficient length to accommodate the elongated LED. Such an elongated device can be used alone or in an array, for example, in combination with a transparent slab as a UV/blue back light for one of the LCD displays described by Vriens in U.S. Pat. No. 4,822,144.

Such an elongated LED, having for example, a length-to-width ratio of 2 or more, is expected to have a more efficient light extraction and thermal conductivity than an LED of the same area having a ratio near unity.

Embodiment 2

Embodiment 2 is similar to embodiment 1, with the difference that the LED-cup combination, with the cup filled with the phosphor-epoxy mixture, is encapsulated in a transparent epoxy with much larger dimensions and with a dome-shaped top, in essentially the same way as shown in FIG. 1. This gives an epoxy-air interface which lies much farther from the region where the visible light is generated and results in much smaller angles of incidence of the light to the normal on the epoxy-air interface. These smaller angles in turn lead to a much enhanced transmission of the light through this interface and to a more narrow angular distribution of the emitted light.

The epoxy used for encapsulation does not contain phosphor material and need not be of the same type as the epoxy used for filling the cup. The small glass plate used for UV protection may be positioned between the two epoxies.

Embodiment 2 can be used, and should preferably be used, in the case of either application of single LED's or when more LED's are used in 1- or 2-dimensional arrays, when the application allows the use of a relatively large spacing between the separate LED's. The use of larger spacings between the individual LED's is advantageous for reducing heating problems.

Embodiment 3

Figure 3:
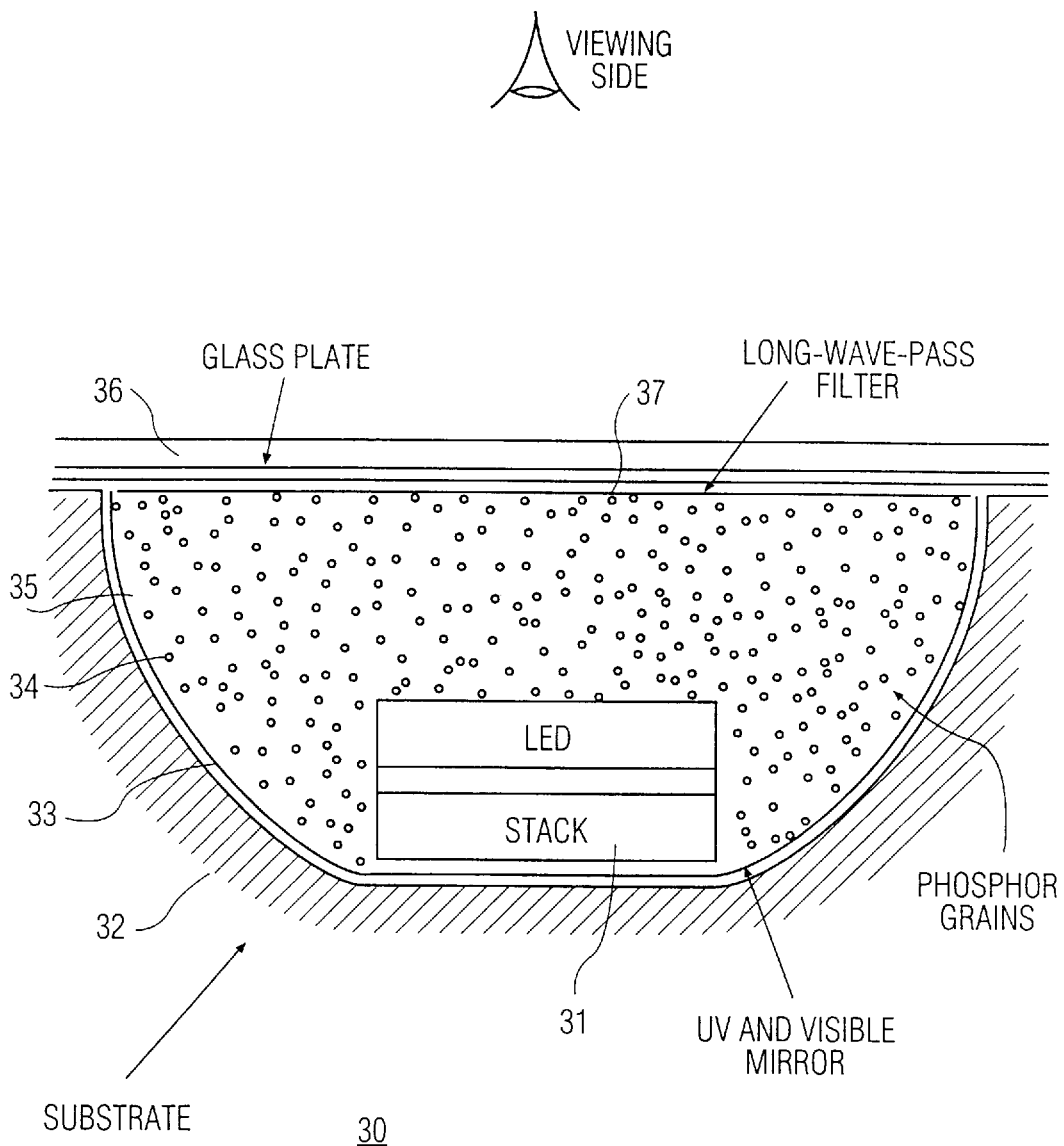
FIGS. 3 to 5 are diagrams similar to that of FIG. 2 illustrating additional embodiments of the invention.

FIG. 3 shows a third embodiment 30 of the present invention. FIG. 3 is the same as FIG. 2, except that a long-wave pass (LWP) filter 37 is added, positioned on the front (viewing) side of the LED stack 31. This LWP filter can be made, for example, by evaporation or sputtering onto the glass plate 36, which is then used as before for additional UV protection. The preferred LWP filters are multilayer dielectric stacks with alternatingly high and low refractive index. The functions of the LWP filter are: (1) to reflect UV/blue light back to the phosphor and (2) to transmit visible light emitted by the phosphor. This ensures a better absorption of the UV/blue by the phosphor and also makes it possible to reduce the phosphor grain density somewhat. This in turn enhances the transmission of the visible light. Furthermore, the reflection of UV/blue gives a protection for the epoxy which may be used for encapsulation and gives a protection for the viewers. The overall result is a more efficient use of both the UV and visible light and a better UV protection.

Embodiment 4

Embodiment 4 is similar to embodiment 3, with the difference that the LED-cup combination, with the cup filled with the phosphor-epoxy mixture and on the top the glass plate with LWP filter, is encapsulated in a transparent epoxy with much larger dimensions and with the dome on the top in the same way as shown in FIG. 1. This again gives an interface to air which lies much farther from the region where the visible light is generated and thus results again in smaller angles of incidence with respect to the normal, of the visible light on the interface to air.

These smaller angles of incidence lead to an enhanced transmission of light through this interface and to a more narrow overall angular distribution of the emitted light.

Embodiment 5

Embodiment 5 is the same as embodiment 3 except that instead of a long-wave-pass filter, a short-wave pass (SWP) filter 47 is added on the front (viewing) side of the LED stack 41. This SWP filter can also be made, for example, by evaporation or sputtering onto the afore mentioned glass plate. The glass plate 46 is then used as before for UV protection.

The preferred SWP filters are multilayer dielectric stacks with alternatingly high and low refractive index and with preferably at least 12 layers, most of these of the so called quarter-wave type. For different devices, projection TV tubes in particular, such SWP filters have been described in Vriens et al. U.S. Pat. Nos. 4,634,926; 4,647,812 and 4,882,617. These filters can be used for UV/blue LED-phosphor devices provided with a one-color for example red, green or blue) phosphor which emits broadband or multi-line light, as usual for phosphors. The functions of the SWP filter are: (1) to reflect light of too long wavelength and (2) to reflect part of the light of the wanted wavelengths. Without the filter, this latter light exits into air at both small and large angles to the normal (with the so-called Lambertian or cosine distribution). With the filter, the large-angle light is reflected by the filter and subsequently multiply scattered, angularly redistributed and back-reflected by the phosphor grains to the filter. A significant part of this light can then exit into air at small angles to the normal on the surface. The overall result is a more narrow angular distribution with up to a factor of 2 gain in light intensity in the forward direction, and furthermore a more saturated (i.e. more pure) color. For applications where a more directed beam of light is needed, for example, in optical systems with a relatively small collection angle, this is an advantage. More saturated colors enhance the visibility. For applications such as traffic lights both these advantages may be important. For a different application, projection TV, the functioning of these short-wave pass interference filters in combination with a phosphor layer is explained in detail by Vriens et al. in Philips Technical Review, Vol. 44, No 7, 1989.

Embodiment 6

Embodiment 6 is the same as embodiment 5 except that the LED-cup combination is encapsulated in a transparent epoxy with much larger dimensions and with a domed top in the same way as shown in FIG. 1.

Embodiment 7

Embodiment 7 is a preferred embodiment which combines the advantages of embodiments 3 and 5. This is achieved by using a bandpass (BP) interference filter in place of the afore described LWP and SWP filters on the front (viewing) side of the LED stack 41. On the short-wavelength side this BP filter has the characteristics of the LWP filter, ie, it reflects UV/blue and transmits visible light. On the long-wavelength side it has the characteristics of the SWP filter, ie, it reflects visible light of too long wavelengths at all angles and it reflects visible light of shorter wavelengths at large angles.

The preferred band pass filters are also multilayer dielectric stacks with alternately high and low refractive index, also with preferably at least 12 layers, with a slightly different thickness distribution from that of the SWP filter.

Embodiment 8

Embodiment 8 is the same as embodiment 7 except that the LED-cup combination is encapsulated in a transparent epoxy with much larger dimensions and with a domed top in the same way as shown in FIG. 1.

Embodiment 9

Figure 4:
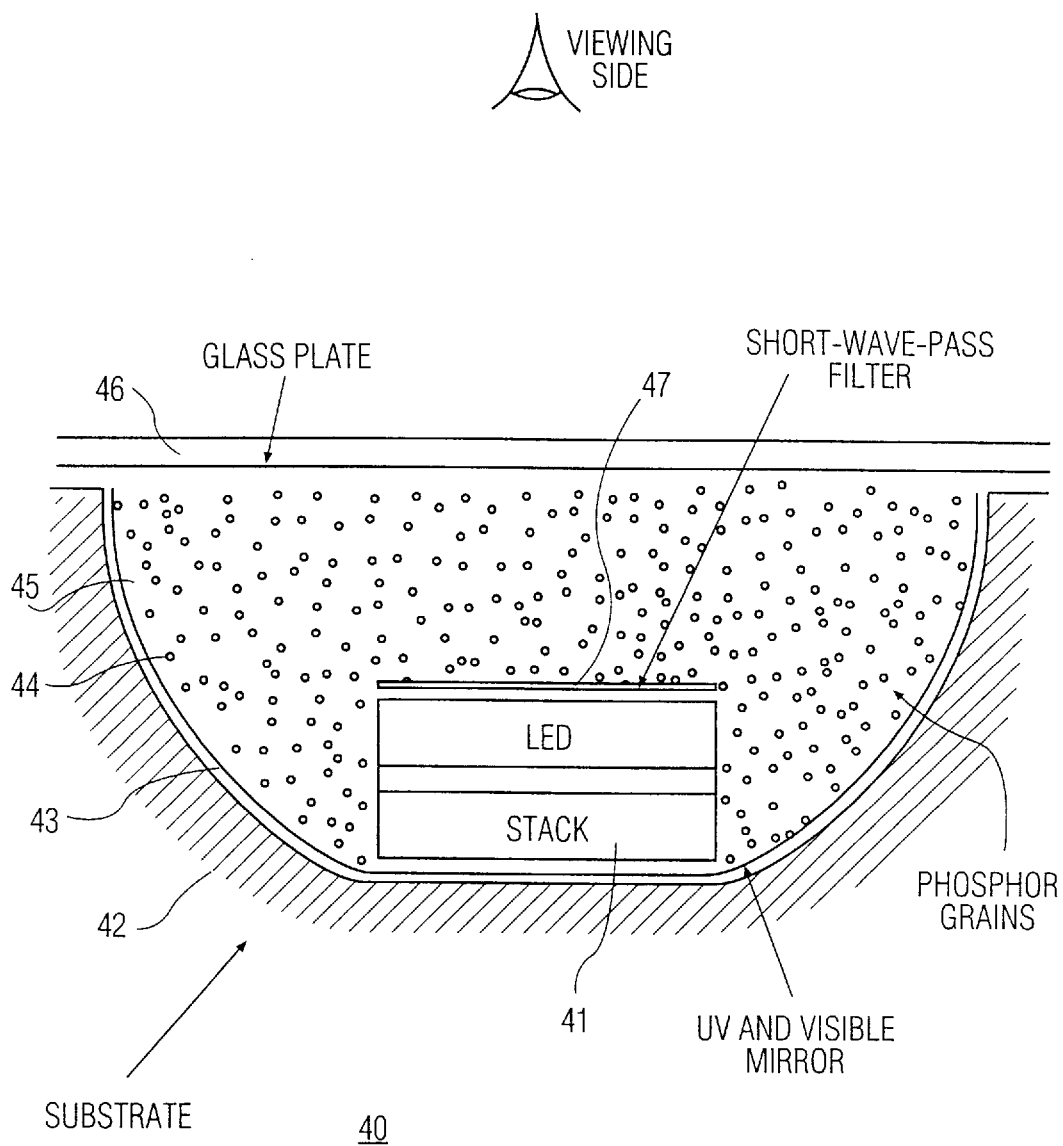

FIG. 4 shows another embodiment 40 of the present invention. FIG. 4 is identical to FIG. 2 except that a UV/blue transmitting and visible light reflecting filter 47 is added directly to the top of the LED stack 41. This is also a short-wave-pass (SWP) filter, although it is placed at a different position and has a different function than the SWP filter described in embodiment 5. The use of the SWP filter directly on the top of the LED stack has the advantage that visible light emitted by the phosphor grains in the direction of the LED stack is reflected by this filter towards the viewing side. This visible light thus does not have to pass through the LED stack twice, which would always lead to some increased losses.

The overall intensity is thus increased at the cost of a slightly more complicated structure.

Embodiments 10 to 12

These embodiments are the combinations of embodiment 9 with the UV/blue absorbing glass plate on the top, and with this glass plate provided with a filter, which may be either a LWP filter, a SWP filter or a bandpass filter.

Embodiments 13 to 15

These are embodiments 10 to 12 with the encapsulation in epoxy with larger dimensions and with the dome shape on the top.

Embodiment 16

Figure 5:
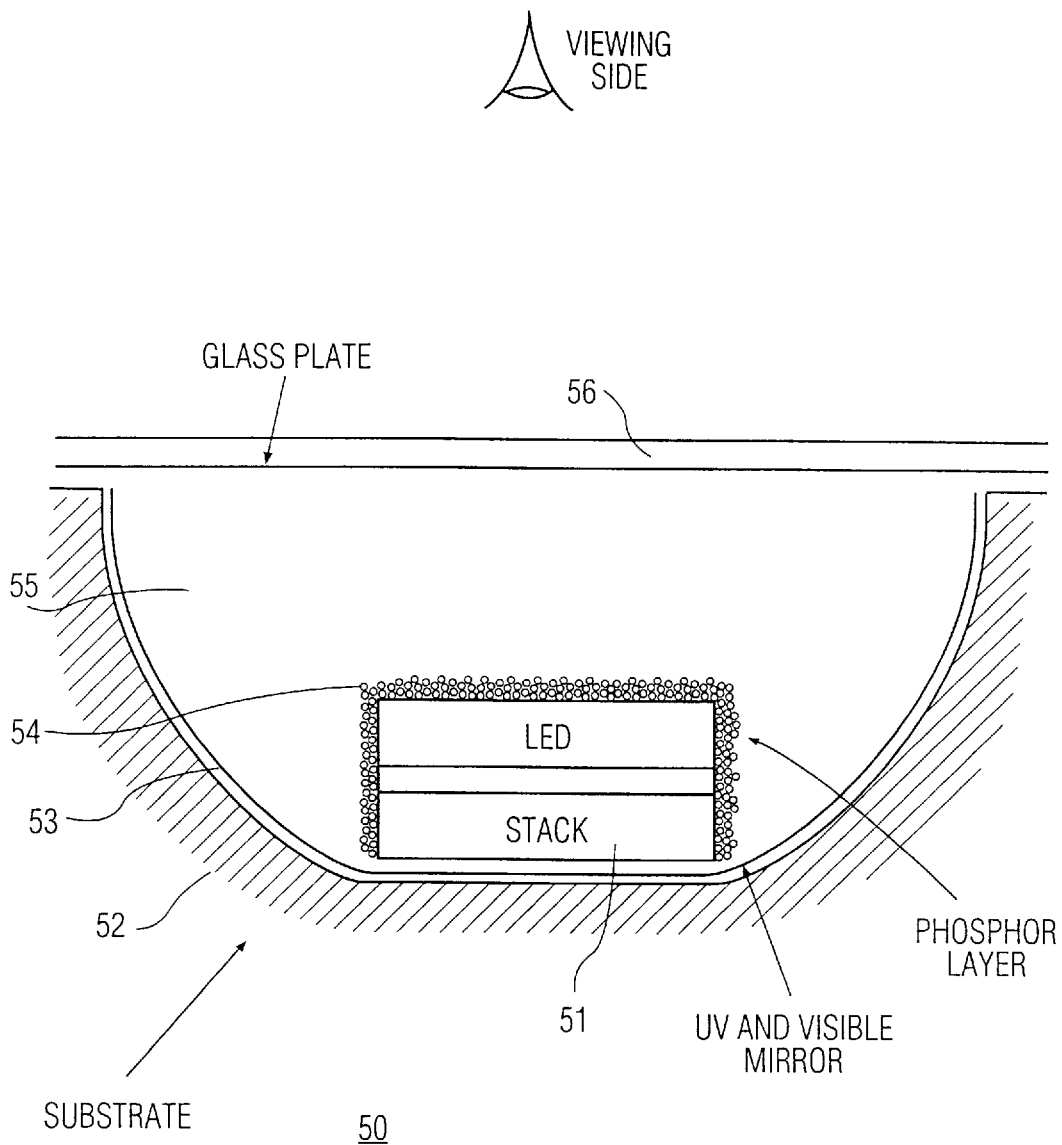

The afore described preferred embodiments of the invention are particularly suitable when the wavelength of the UV/blue light is not too short, for example above 390 nm. When shorter wavelengths are used, in the range from 360 to 390 nm, in particular close to 360 nm, it is more difficult to find a UV resistant epoxy. In that case it may be advantageous to deposit the phosphor grains 54 as close as possible to the LED stack 51, as illustrated in the preferred embodiment shown in FIG. 5. The cup shaped header 52 may then be filled with epoxy 55, which is still as resistant as possible for UV/blue light. All further additions as described in embodiments 2 to 15 may then be applied.

The invention has necessarily been described in terms of a limited number of embodiments and variations thereof. Other embodiments and variations of embodiments will become apparent to those skilled in the art, and are intended to be encompassed within the scope of the appended claims.

What we claim as our invention is:

1. A visible light emitting device comprising: a supporting body having an upper surface with a depression having an opening in the upper surface; a UV and blue and visible light-reflecting layer on the surface of the depression; a UV and blue light emitting diode (UV and blue LED) centrally located on the light reflecting layer; the LED having an active region with a first index of refraction; particles of a visible light emitting phosphor surrounding the sides and top of the LED; and a UV and blue and visible light transmitting material surrounding the LED and filling the depression, the UV and blue and visible light transmitting material having a second index of refraction lower than the said first index of refraction.

2. The visible light emitting device of claim 1 in which the phosphor grains are dispersed in the UV and visible light transmitting material.

3. The visible light emitting device of claim 1 in which the phosphor grains are adhered to the sides and/or top of the LED.

4. The visible light emitting device of claim 1 in which a UV and blue light-absorbing, visible-light transmitting plate covers the opening of the depression.

5. The visible light emitting device of claim 4 in which a long wave pass filter (LWP) is located on the lower surface of the plate.

6. The visible light emitting device of claim 4 in which a short wave pass (SWP) filter is located on the lower surface of the plate.

7. The visible light emitting device of claim 4 in which a band pass (BP) filter is located on the lower surface of the plate.

8. The visible light emitting device of claim 1 in which a SWP filter is located on the upper surface of the LED.

9. The visible light emitting device of claim 4 in which a LWP, SWP or BP filter is located on the lower surface of the plate.

10. The visible light emitting device of claim 1 in which the device is encapsulated in a visible light transmitting material having a third refractive index which is lower than the first refractive index.

11. The visible light emitting device of claim 10 in which the upper surface of the material is dome-shaped.

12. The visible light emitting device of claim 1 in which the depression is substantially circularly symmetric.

13. The visible light emitting device of claim 1 in which the LED is elongated in one direction perpendicular to the top surface of the LED, and in which the depression is channel-shaped, with a length dimension sufficient to accommodate the LED.

14. The visible light emitting device of claim 1 in which the visible light transmitting material is a cycloaliphatic epoxy.

15. The light emitting device of claim 1 in which the phosphor grains have a fourth refractive index larger than the second refractive index of the light transmitting material.

16. The light emitting device of claim 1 in which the upper surface of the light transmitting material is roughened.

* * * * *